(12) United States Patent
Kim et al.

(10) Patent No.: US 6,977,200 B2
(45) Date of Patent: Dec. 20, 2005

(54) METHOD OF MANUFACTURING SPLIT-GATE MEMORY

(75) Inventors: Yong-hee Kim, Gyeonggi-do (KR); Chul-soon Kwon, Seoul (KR); Jin-woo Kim, Gyeonggi-do (KR); Joo-chan Kim, Seoul (KR); Dae-geun Kim, Gyeonggi-do (KR); Eui-youl Ryu, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/982,784

(22) Filed: Nov. 8, 2004

(65) Prior Publication Data

US 2005/0112821 A1   May 26, 2005

(30) Foreign Application Priority Data

Nov. 26, 2003  (KR) ...................... 10-2003-0084733

(51) Int. Cl.[7] .......................................... H01L 21/336
(52) U.S. Cl. ...................... 438/257; 438/264; 438/266
(58) Field of Search ................. 438/257, 264, 438/266

(56) References Cited

U.S. PATENT DOCUMENTS

| 6,348,378 | B1 * | 2/2002 | Lee .............................. 438/257 |
| 6,649,471 | B2 * | 11/2003 | Cho et al. .................... 438/257 |
| 6,683,340 | B2 * | 1/2004 | Kim et al. ................... 257/300 |
| 6,756,629 | B1 * | 6/2004 | Furuhata ...................... 257/314 |
| 2004/0248367 | A1 * | 12/2004 | Shyu et al. .................. 438/257 |

FOREIGN PATENT DOCUMENTS

| KR | 10-0275220 | 2/2003 |
| KR | 2003-0027393 | 4/2003 |

* cited by examiner

Primary Examiner—Trung Dang
(74) Attorney, Agent, or Firm—Volentine Francos & Whitt P.L.L.C.

(57) ABSTRACT

A method of manufacturing split-gate memory provides a control gate insulating film and the tunneling insulating film in a cell region, a high voltage gate insulating film in a high voltage region, and a low voltage gate insulating film in a low voltage region, all having different thickness. Additionally, a pre-cleaning process removes an outer sidewall portion of a spacer to form a tip portion of a floating gate that overlaps a control gate line formed proximate the floating gate.

20 Claims, 16 Drawing Sheets

METHOD OF MANUFACTURING SPLIT-GATE MEMORY

BACKGROUND OF THE INVENTION

1. Field of the Invention

The present invention relates to a method of manufacturing a non-volatile memory. More particularly, the present invention relates to a method of manufacturing a split-gate flash memory having a cell region and peripheral circuit regions.

A claim of priority is made to Korean Patent Application No. 2003-84733 filed on Nov. 26, 2003, the disclosure of which is incorporated herein by reference in its entirety.

2. Description of the Related Art

A non-volatile memory maintains data stored in its constituent memory cells even in those circumstances where power is not applied to the memory. Examples of non-volatile memory types include; mask ROMs, erasable and programmable ROMs (EPROMs), and an electrically erasable and programmable ROM (EEPROMs). Flash memory is one form of EEPROM in which one transistor constitutes one memory cell.

Different flash memory types include the stacked gate flash memory and the split-gate flash memory. As the names suggest, these flash memory types are differentiated according to their corresponding cell transistor gate structure. A stacked gate flash memory includes a floating gate for storing charge, and a control gate for controlling operation of the device. As physically implemented, these two gate structures are stacked one over the other.

A split-gate flash memory also includes a floating gate and a control gate. However, in the split-gate flash memory, the control gate is physically implemented next to (or laterally adjacent to) the floating gate. Conventional split-gate flash memories are characterized by excellent efficiency in their erasure/program functionality. This high efficiency effectively protects split-gate memories from inadvertent over-erasure of stored data. As a result, split-gate flash memories are widely used. An example of one conventional split-gate flash memory device is disclosed in U.S. Pat. No. 6,524,915.

FIGS. 1 to 9 are cross-sectional views illustrating a conventional method adapted to the manufacture of a split-gate flash memory.

Referring to FIG. 1, a coupling insulating film 2, a floating gate conductive film 3 formed from a conductive polycrystalline silicon, and a mold film 4 formed from a nitride film are collectively formed on a substrate 1. The substrate can readily be divided into a cell region "a" and peripheral circuit regions "b" and "c". A trench 5 is formed by patterning the mold film 4, such that a predetermined portion of the floating gate conductive film 3 is exposed within in cell region "a". A thermal oxide film 27 is formed by thermal oxidation of the floating gate conductive film 3 portion exposed by trench 5. Alternatively, an end portion of the floating gate, on which an electric field is concentrated when the completed memory device is erased, is formed by recessing a portion of the floating gate conductive film 3 exposed by trench 5 by a predetermined thickness before performing a thermal oxidation process to form thermal oxide film 27.

Preliminary spacers 6 formed from a silicon oxide film are formed on both sides of trench 5. Preliminary spacers 6 and the mold film 4 are used as etching masks to etch the floating gate conductive film 3 and the coupling insulating film 2 to expose a region of semiconductor substrate 1. Ions are implanted into the exposed region on the semiconductor substrate 1 to form a source junction region 7. A liner oxide film (not shown) is then formed on the entire surface of the substrate 1 and etched to form liner spacers 8 on the sides of preliminary spacers 6 and the exposed sidewalls of floating gate 3. Liner spacers 8 and preliminary spacers 6 may be collectively grouped together as individual spacers 9. A source conductive film 10 formed from a conductive polycrystalline silicon is formed on the entire surface of semiconductor substrate 1, such that trench 5 is filled with the source conductive film 10.

Referring to FIG. 2, Chemical Mechanical Polishing (CMP) is performed on the source conductive film 10 until a portion of mold film 4 is exposed (not shown), thereby forming a source line 10a in trench 5. An upper portion of source line 10a is thermally oxidized to form a mask film 10b. The residual exposed portion of mold film 4, most of floating gate conductive film 3 and coupling insulating film 2 are sequentially etched to expose portions of semiconductor substrate 1 in the cell region "a" extending beyond the cell structure shown in FIG. 2. Portions of semiconductor substrate 1 in the peripheral circuit regions "b" and "c" are similarly exposed.

Referring now to FIG. 3, an oxide film 11 is formed on the entire surface of the exposed semiconductor substrate 1 to form a control gate insulating film and a high voltage gate insulating film.

Referring to FIG. 4, the portion of oxide film 11 covering low voltage region "c" of the semiconductor substrate is removed by dry etching with the use of a photoresist pattern 50.

Referring to FIG. 5, an oxide film 12 is thereafter formed on the surface of the low voltage region "c" of the semiconductor substrate to form a low voltage gate insulating film 12. In the process of forming low voltage gate insulating film 12, the thickness of portion 11a of the control gate insulating film and the tunneling insulating film on the cell region "a" of the semiconductor substrate, and the thickness of portion 11a of the high voltage gate insulating film on the high voltage region "b" of the semiconductor substrate are both increased by a thickness corresponding to the thickness of low voltage gate insulating film 12.

Referring to FIG. 6, a control gate conductive film 22 formed from a conductive polycrystalline silicon film and an oxidation prevention film 23 formed from a silicon nitride are formed on the control gate insulating film/high voltage gate insulating film 11a and low voltage gate insulating film 12.

Referring to FIG. 7, CMP is performed on the oxidation prevention film 23 and the control gate conductive film 22 until the upper surface of the source line 10a is exposed. Accordingly, the oxidation prevention film pattern 23a is largely removed from cell region "a", and upper surface portions of the control gate conductive 22 are exposed between each spacer 9 and the oxidation prevention film pattern 23a. In peripheral circuit regions "b" and "c", an oxidation prevention film pattern 23a is formed during the same processing step(s) used to form the oxidation prevention film pattern 23a found in cell region "a". Thus, upper surface portions of the exposed control gate conductive film 22 in cell region "a" and an upper surface of source line 10a are thermally oxidized to form a hard mask film 25.

Referring now to FIG. 8, the oxidation prevention film 23a is etched away using the hard mask film 25 as an etching mask to expose the control gate conductive film 22. A photoresist film is formed in peripheral circuit regions "b" and "c" to pattern a transistor gate.

Referring to FIG. 9, control gate conductive film 22 is etched using hard mask film 25 and photoresist pattern 60 as etching masks to form a control gate line 22a in cell region "a", a high voltage transistor gate 22b in the high voltage region "b", and a low voltage transistor gate 22c in the low voltage region "c". After nitride spacers are formed on the sidewalls of control gate line 22a, a portion of the semiconductor substrate 1 on which a drain junction region will be formed is exposed. Ions are implanted in semiconductor substrate 1 to form a drain junction region (not shown). Numerical reference 11a denotes an insulating film formed by a deposition process, which serves as a tunneling insulating film at a tip portion 30 of the floating gate 3a, and which serves as a control gate insulating film under control gate 22a and high voltage gate insulating film on high voltage region "b".

Staying with FIG. 9, an erase and program operation(s) for the conventional split-gate flash memory will be described. In the program operation, a high voltage $V_{DD}$ is applied to a source junction region through source line 10a. A low voltage (e.g., between 0 and 1.0 Volts) is applied to a drain junction region. Under these voltage conditions, electrons generated in the drain junction region move towards the source junction region through a channel region inverted slightly by a threshold voltage $V_{th}$ applied to the control gate 22a. The electrons moving toward the source junction region are excited by the potential difference between the drain junction region and the floating gate 3a which is coupled to high voltage $V_{DD}$ applied via source line 10a. In this manner, electrons are injected into the floating gate 3a. In other words, the program operation is performed by hot carrier injection into the floating gate 3a.

In an erase operation, high voltage $V_{DD}$ is applied to control gate 22a and a low voltage is applied to the source and drain junction regions. The electrons accumulated in floating gate 3a leaked out from the tapered tip of floating gate 3a to control gate 22a through tunneling insulating film 11a by means of a conventionally understood tunneling (Fowler-Nordheim) phenomenon. Accordingly, the threshold voltage $V_{th}$ for the channel is shifted to a lower value, and the corresponding cell enters into an erasing state.

Referring still to FIG. 9, since the tunneling insulating film 11a is adjacent to the tip 30 of floating gate 3a and has the same thickness as the high voltage gate insulating film 11a near high voltage transistor gate 22b, overall erasing efficiency for the split-gate flash memory device is relatively low. That is, in order to apply sufficient voltage to control gate 22a, high voltage gate insulating film 11a must be relatively thick. In contrast, if tunneling insulating film 11a has the same thickness as the high voltage gate insulating film 11a, electron tunneling remains relatively inactive. As a result, the erasure operation properties of the flash memory device degrade accordingly.

SUMMARY OF THE INVENTION

The present invention provides a method of manufacturing a split-gate flash memory having improved erasure efficiency. In one aspect, erasure efficiency associated with the present invention is enhanced by forming a high voltage gate insulating film and a tunneling insulating film having different thicknesses. In a related aspect, stable erasure voltage, as applied to the control gate of a flash memory device formed in accordance with the present invention, is ensured by the formation of a high voltage gate insulating film having a sufficient thickness.

Thus, in one aspect, the present invention provides a method of manufacturing split gate flash memory on a substrate. The substrate surface being divided into a cell region and peripheral regions, and the peripheral regions including a high voltage region and a low voltage region. The method comprises forming a floating gate on the cell region, forming a first insulating film on the surface of the semiconductor substrate, selectively etching the first insulating film to remove the first insulating film from the cell region, forming a first oxide film on the surface of the semiconductor substrate to form a second insulating film on the cell region and a third insulating film on the peripheral circuit regions, selectively etching the third insulating film to remove the third insulating film formed on the low voltage region, and forming a second oxide film on the surface of the semiconductor substrate to form a fourth insulating film in the low voltage region.

In this configuration, the second insulating film forms a control gate insulating film and a tunneling insulating film in the cell region, the third insulating film forms a high voltage gate insulating film in the high voltage region, and the fourth insulating film forms a low voltage gate insulating film in the low voltage region.

As presently preferred, the control gate insulating film and the tunneling insulating film are thicker than the low voltage gate insulating film, and the high voltage gate insulating film is thicker than the control gate insulating film and the tunneling insulating film.

In a related aspect, the floating gate comprises; a coupling insulating film formed on the semiconductor substrate, a floating gate formed on the coupling insulating film, a thermal oxide film formed on the floating gate, a spacer formed to surround the floating gate, the thermal oxide and the coupling insulating film, and a source line contacting the spacer. Wherein the floating gate further comprises a step between a tip portion of the floating gate and the first spacer.

In another related aspect, formation of the floating gate comprises; sequentially forming a coupling insulating film, a floating gate conductive film and a mold film on the surface of the semiconductor substrate, selectively etching the mold film in the cell region to form a trench exposing a portion of the floating gate conductive film, forming a thermal oxide film on the exposed portion of the floating gate conductive film, forming preliminary spacers on sidewalls of the trench, sequentially etching a region of the exposed floating gate conductive film between the preliminary spacers and an underlying portion of the coupling insulating film using the mold film and the preliminary spacers as an etching mask to expose a portion of the semiconductor substrate, forming liner spacers on exposed surfaces of the preliminary spacers and exposed sidewalls of the floating gate conductive film, implanting ions into the exposed portion of the semiconductor substrate to form a source junction region, forming a source line between the liner spacers, and sequentially removing portions of the mold film, the floating gate conductive film, and the coupling insulating film to expose at least portions of the semiconductor substrate corresponding to peripheral regions.

The yet another related aspect, the formation of the floating gate on the cell further comprises performing a pre-cleaning before formation of the first insulating film, wherein the pre-cleaning removes an outer sidewall portion of the preliminary spacer to form a tip portion of the floating gate overlapping a control gate line formed proximate the floating gate.

The preferably comprises applying a cleaning agent containing hydrofluoric acid.

In another aspect, the second insulating film forming the a control gate insulating film and the tunneling insulating film in the cell region, the third insulating film forming the high voltage gate insulating film in the high voltage region, and the fourth insulating film forming the low voltage gate insulating film in the low voltage region have different thickness. More preferred, the second insulating film is thicker than the fourth insulating film, but less thick than the third insulating film.

BRIEF DESCRIPTION OF THE DRAWINGS

The above and other features and advantages of the present invention will become more apparent upon consideration of several exemplary embodiments to the present invention with reference to the attached drawings. In the drawings, layer thicknesses and region areas are exaggerated for purposes of clarity. Like reference numerals denote like elements.

In the drawings.

FIGS. 10 through 26 are cross-sectional views illustrating a method of manufacturing a split-gate flash memory according to one embodiment of the present invention; and.

DETAILED DESCRIPTION OF THE INVENTION

The present invention will now be described in some additional detail with reference to the accompanying drawings. The invention may, however, be embodied in many different forms and should not be construed as being limited to only the embodiments set forth herein. Rather, these embodiments are presently preferred teaching examples. Those of ordinary skill in the art will recognize that various modifications and alterations to the illustrated embodiments are possible. Further, those of ordinary skill understand that when an element such as a layer, region or substrate is referred to as being "on" or "onto" another element, the layer may be either directly on the other element or intervening elements may also be present.

Figure 1:
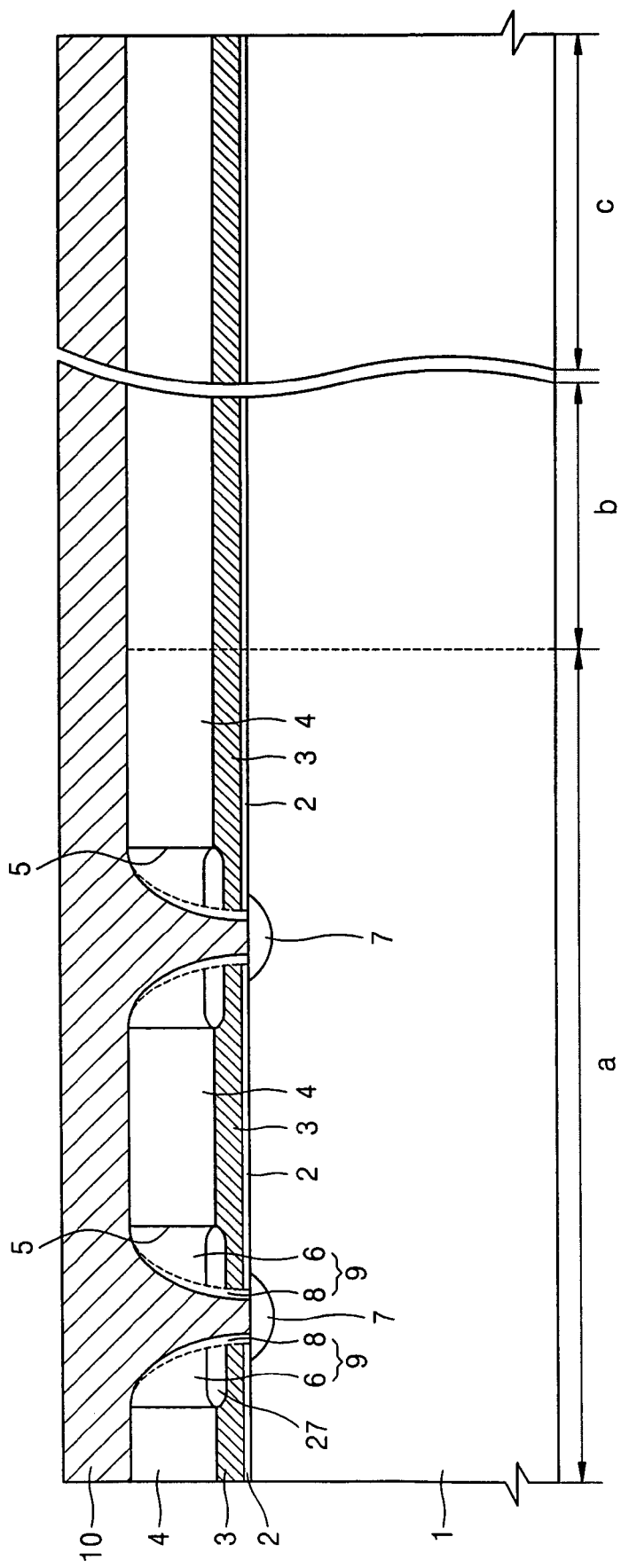
FIGS. 1 through 9 are cross-sectional views illustrating a method of manufacturing a conventional split-gate flash memory.
Figure 2:
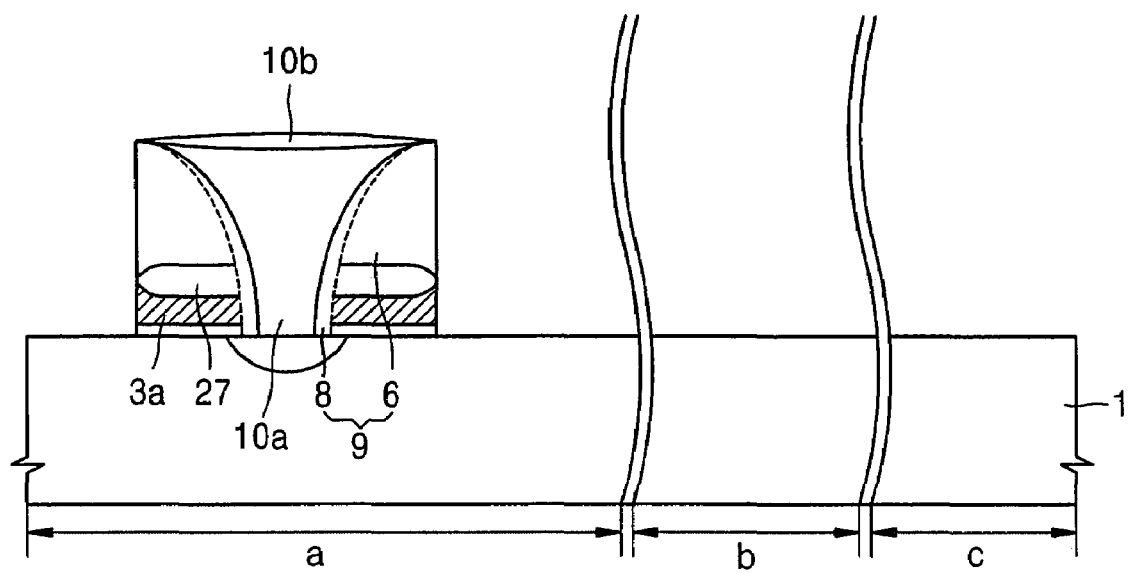
Figure 3:
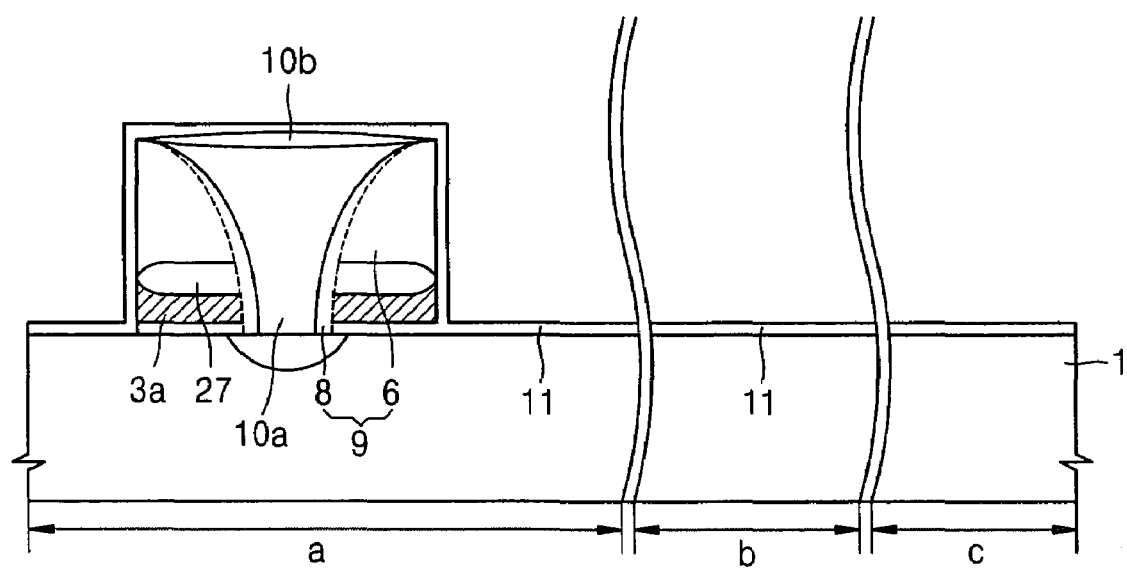
Figure 4:
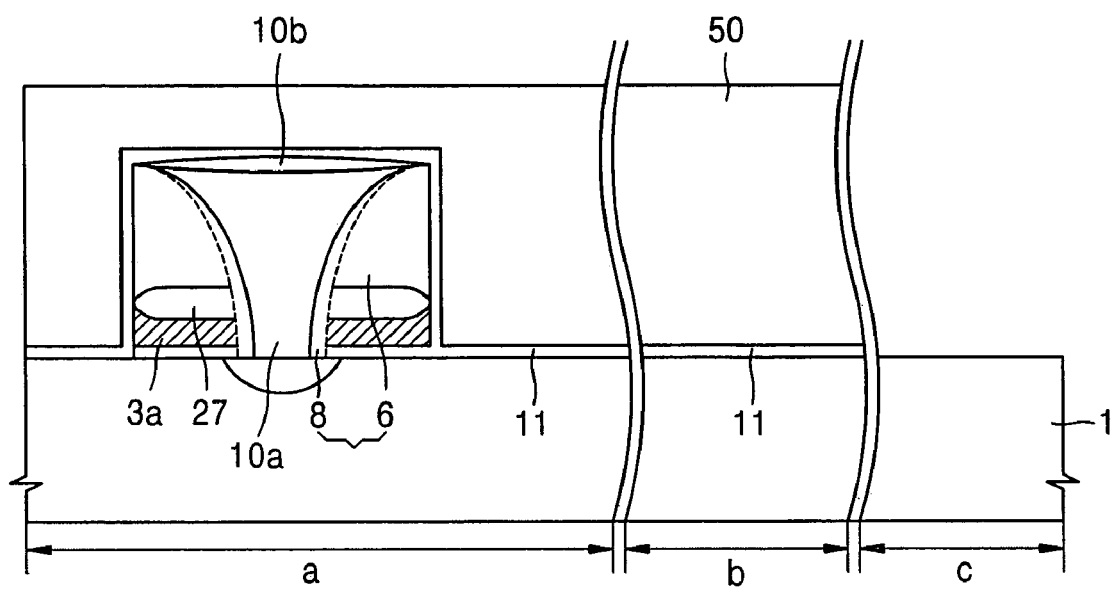
Figure 5:
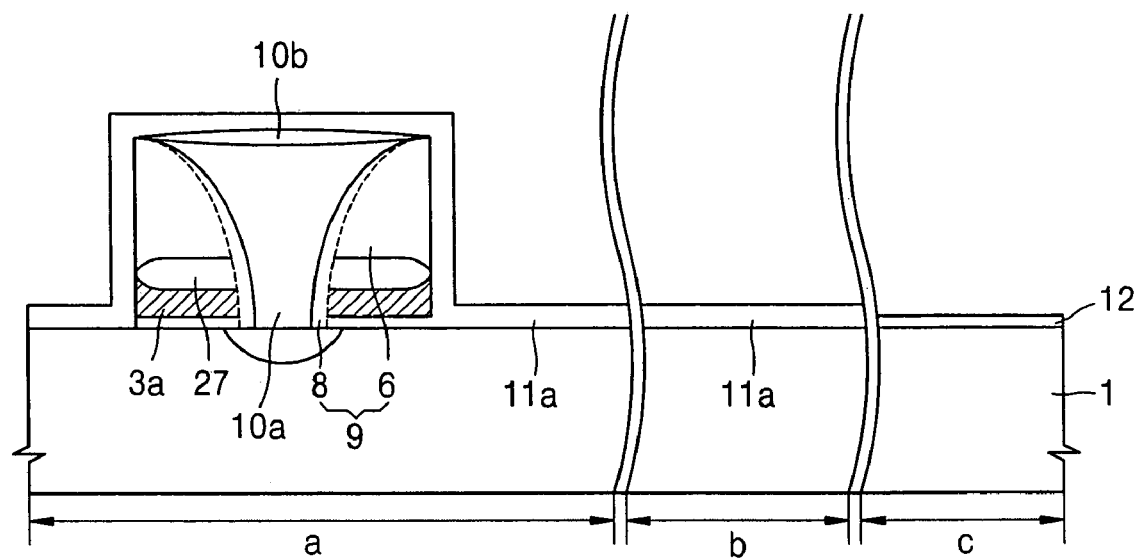
Figure 6:
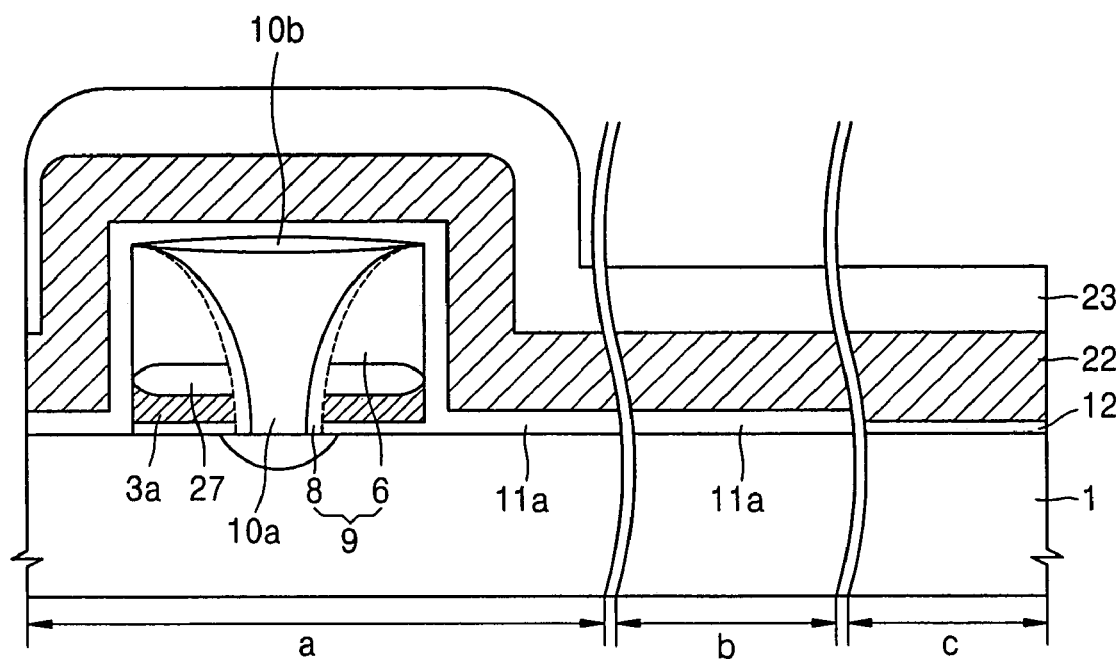
Figure 7:
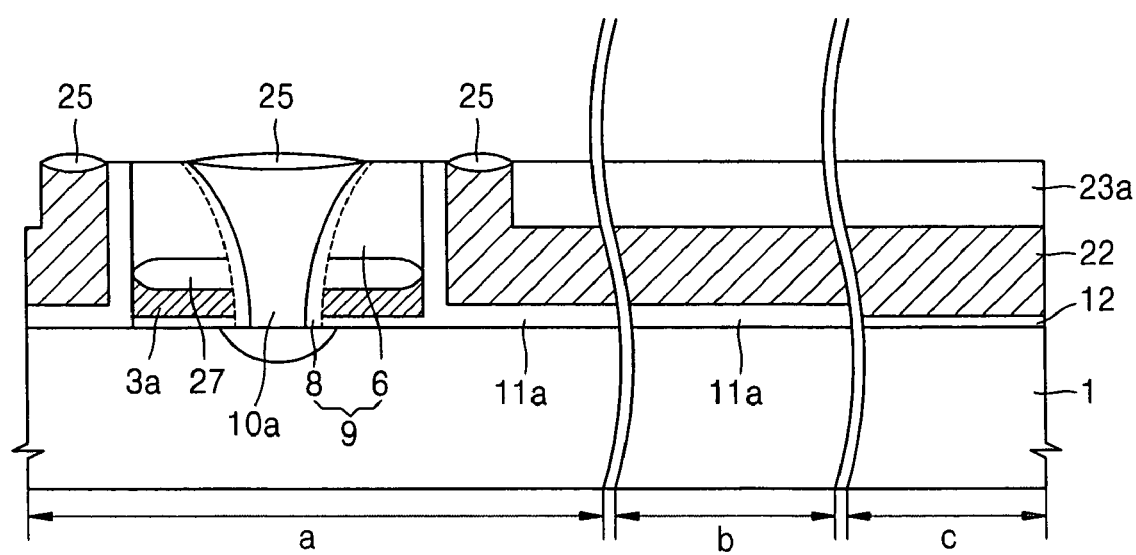
Figure 8:
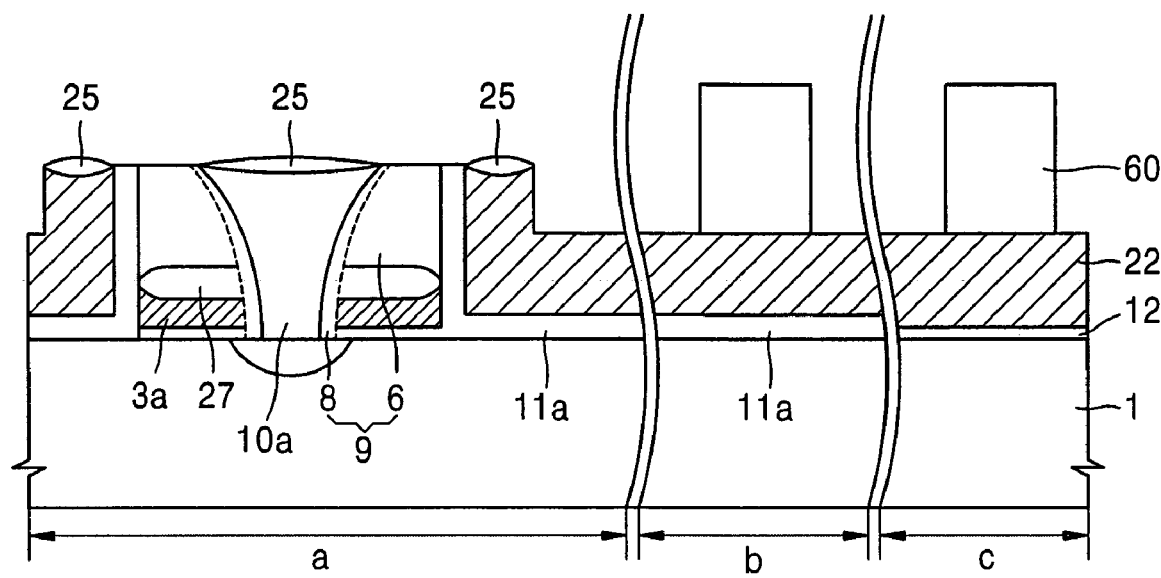
Figure 9:
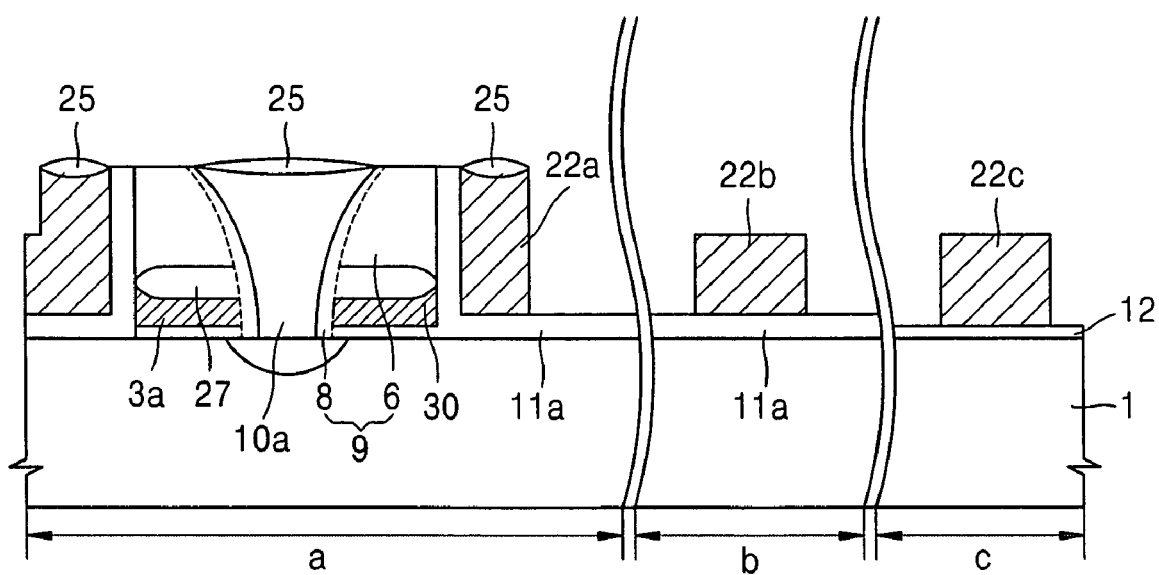
Figure 10:
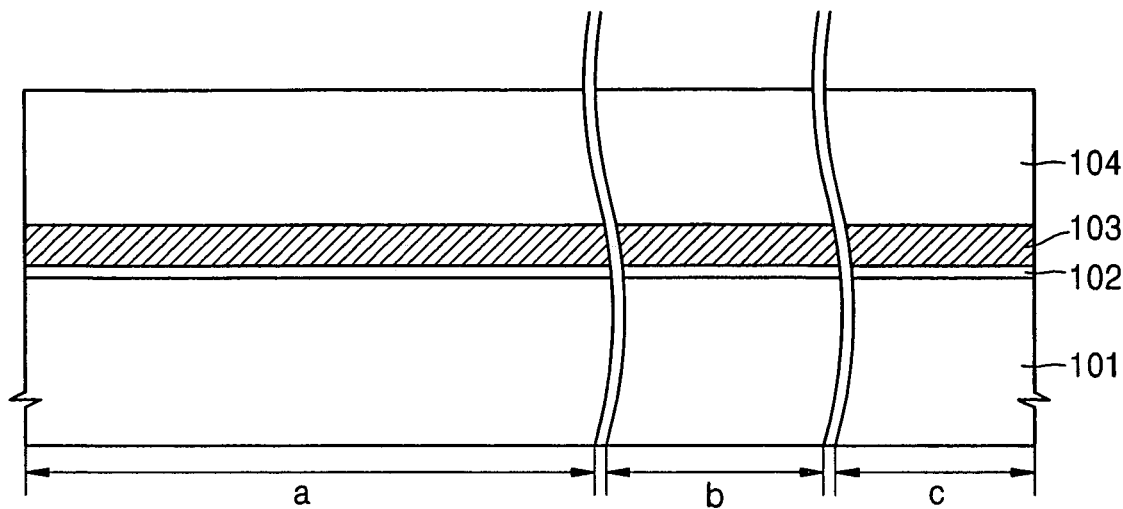

FIGS. 10 through 26 are cross-sectional views illustrating a method of manufacturing a split-gate flash memory according to one embodiment of the present invention. Referring to FIG. 10, a coupling insulating film 102, a floating gate conductive film 103 and a mold film 104 are sequentially formed on a semiconductor substrate 101 preferably of the first conductive type (e.g. a p-type substrate). Semiconductor substrate 101 generally includes peripheral circuit regions "b" and "c" and a cell region "a". The peripheral circuit regions include a high voltage region "b" and a low voltage region "c". Memory cells are formed on the cell region "a". Coupling insulating film 102, floating gate conductive film 103 and mold film 104 are preferably formed with a thickness of about 80 Å, 700–800 Å, and about 4000 Å, respectively. Coupling insulating film 102 is preferably formed from a thermal oxide film. Floating gate conductive film 103 is preferably formed from a doped polycrystalline silicon film. Mold film 104 is preferably formed from a silicon nitride film.

Figure 11:
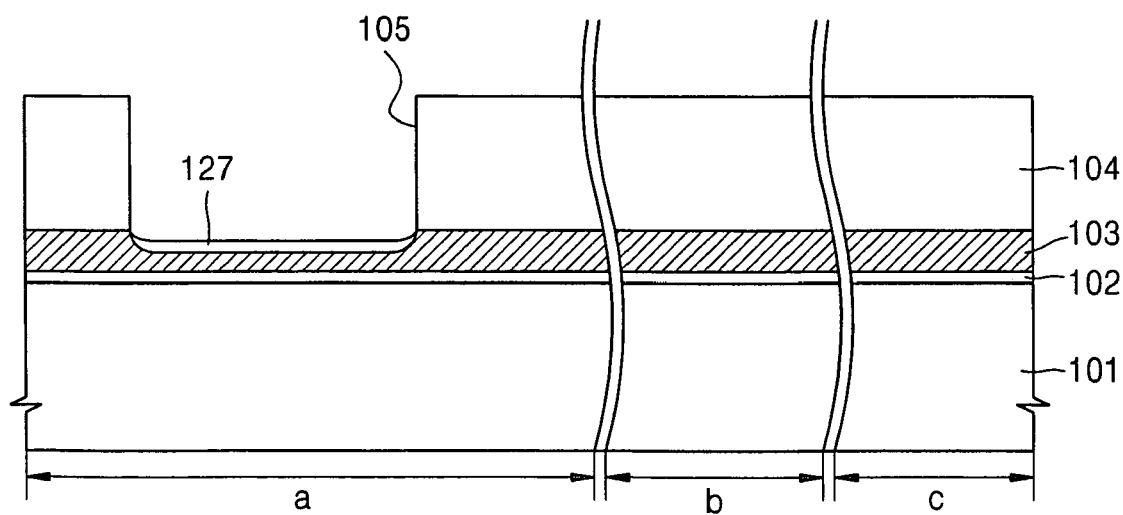

Referring now to FIG. 11, mold film 104 is selectively etched using, for example, a photolithography etching process to expose a portion of floating gate conductive film 103. The exposed portion of floating gate conductive film 103 is further etched to form a trench 105 in a predetermined region of cell region "a". When the exposed floating gate conductive film 103 is further etched, the exposed floating gate conductive film 103 is etched to make both sides of the bottom of trench 105 round. The exposed portion of the floating gate conductive film 103 is then thermally oxidized to form a thermal oxide film 127. Floating gate conductive film 103 is preferably etched to have a bottom surface with rounded corners, because a tip portion of the floating gate (to be formed later) can be made to be acute. If the tip portion of the floating gate is made acute, an electric field formed on the control gate will be more concentrated at the tip portion, thereby enhancing the erasure efficiency of the overall flash memory device.

Figure 12:
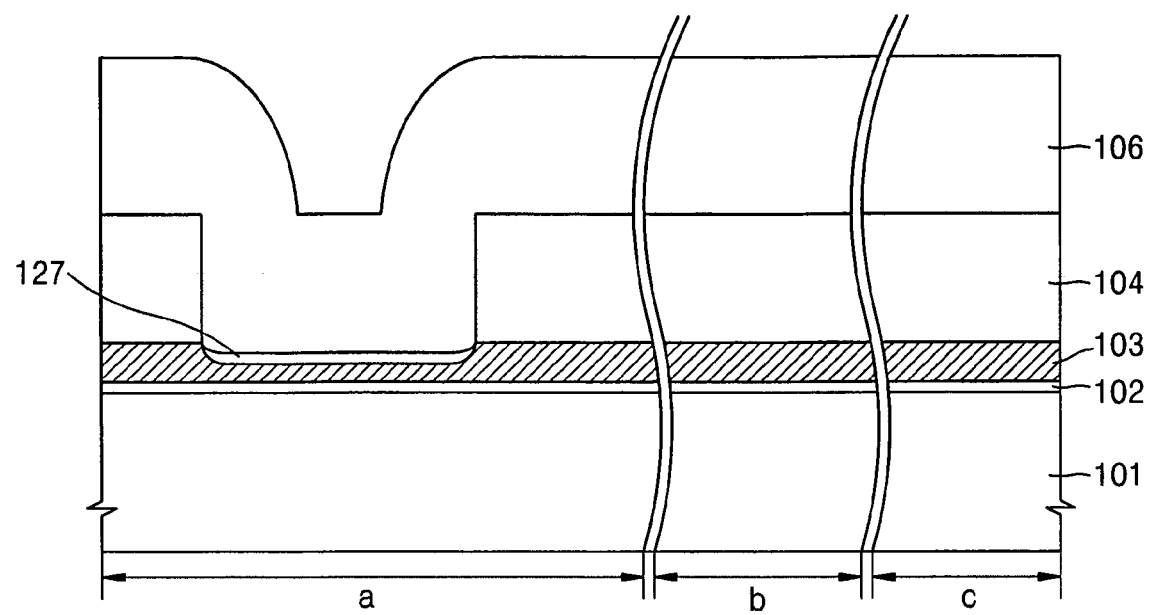

Referring to FIG. 12, a silicon oxide film 106 is formed on the resultant structure shown in FIG. 11 to fully fill trench 105. Silicon oxide film 106 is preferably formed using a high temperature oxide process (hereinafter, referred to as "HTO").

Figure 13:
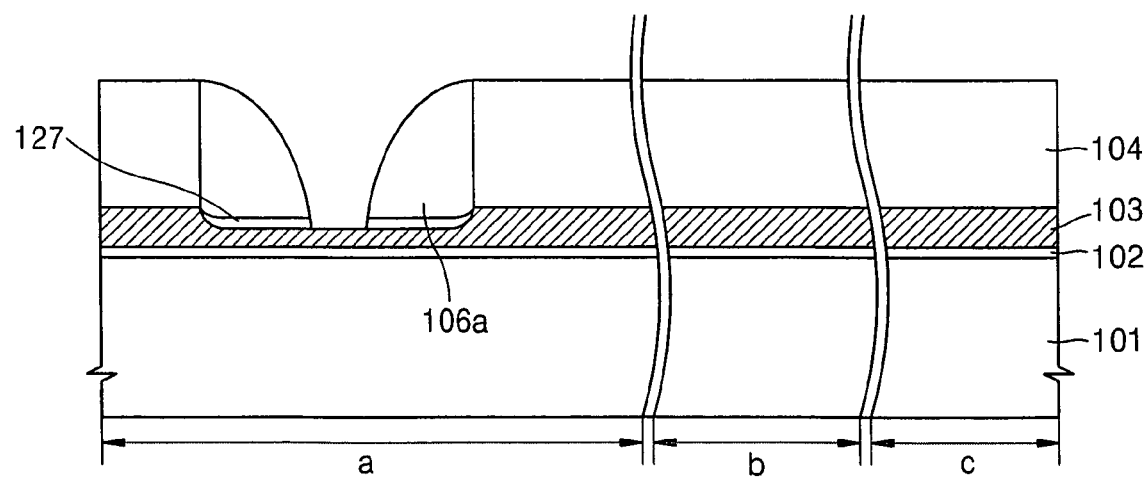

Referring to FIG. 13, silicon oxide film 106 is etch back to form preliminary opposing preliminary spacers 106a covering both sidewalls of trench 105. The etch back process used to form preliminary spacers 106a from silicon oxide layer 106 also exposes a portion of the floating gate conductive film 103.

Figure 14:
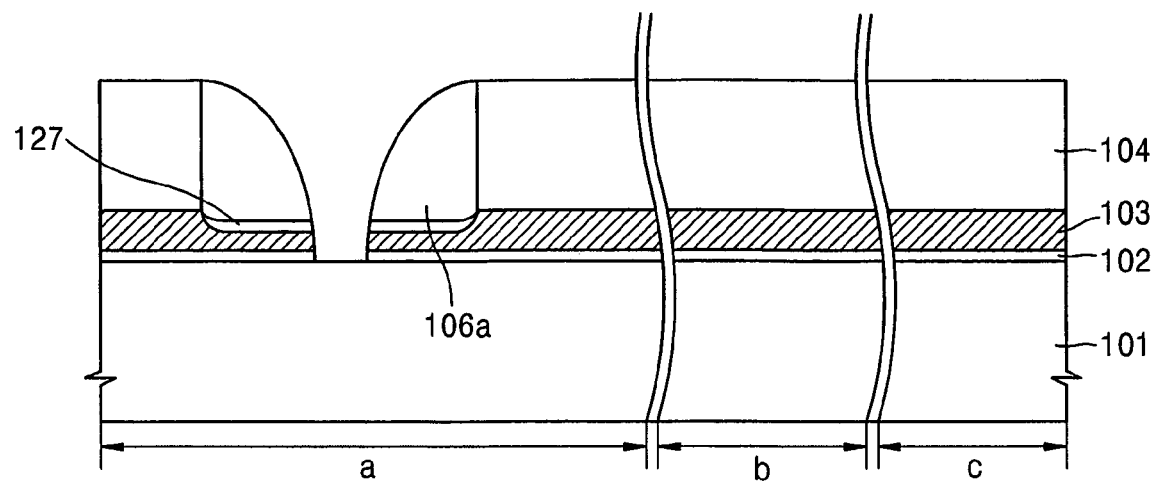

Referring to FIG. 14, the exposed portion of floating gate conductive film 103 and a corresponding portion of the underlying coupling insulating film 102 are sequentially etched using preliminary spacers 106a and mold film 104 as an etch mask. With the selective removal of these two layers, a portion of semiconductor substrate 101 is exposed. Further, this process exposes sidewall portions of the floating gate conductive film 103 proximate the exposed portion of semiconductor substrate 101.

Figure 15:
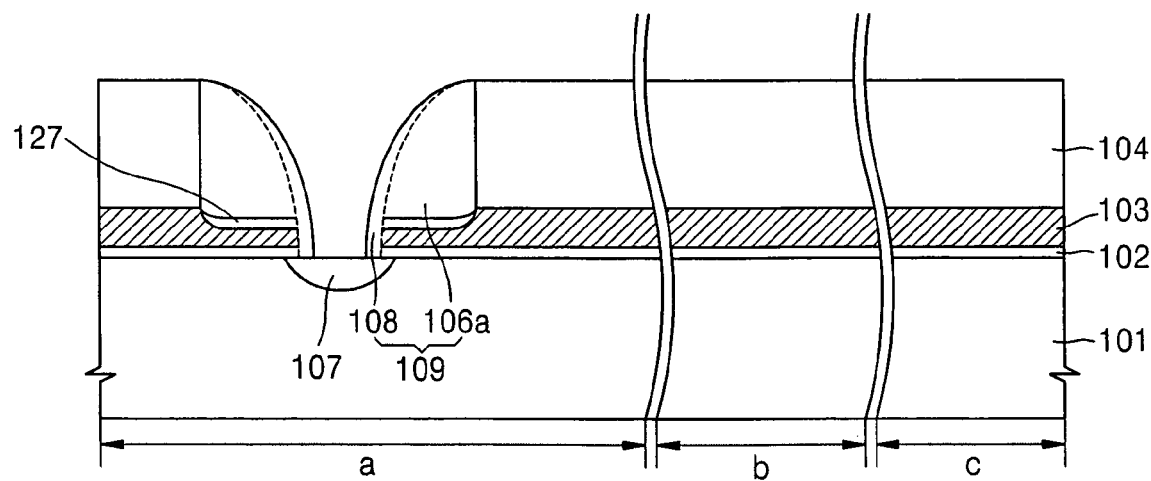

Referring now to FIG. 15, in order to prevent shorting contact between a source line (to be formed in subsequent processes) and the floating gate conductive film 103, insulating liner spacers 108 are formed to cover the sides of the preliminary spacers 106a and the exposed sidewalls of floating gate conductive film 103. These liner spacers 108 are preferably formed by first forming a liner oxide film (not shown) on the entire surface of preliminary spacers 106a and mold film 104 using a CVD process. Thereafter, the liner oxide film is etched back to form liner spacers 108 and to again expose the portion of semiconductor substrate 101 and mold film 104. Preliminary spacers 106a and liner spacers 108 collectively constitute a spacer 109.

At this point in the fabrication process, ions are preferably implanted into the portion of semiconductor substrate 101 exposed between liner spacers 108 to form a source junction region 107 of a second conductive type (e.g. n-type). Alternatively, ions may be implanted into the semiconductor substrate 101 exposed between preliminary spacers 106 to form a source junction region 107, and thereafter liner spacers 108 are formed. However, this alternative may result in the over-etching of semiconductor substrate 101, thus damaging the source junction region 107. It is therefore preferred that the source junction region be formed after formation of the liner spacers.

Figure 16:
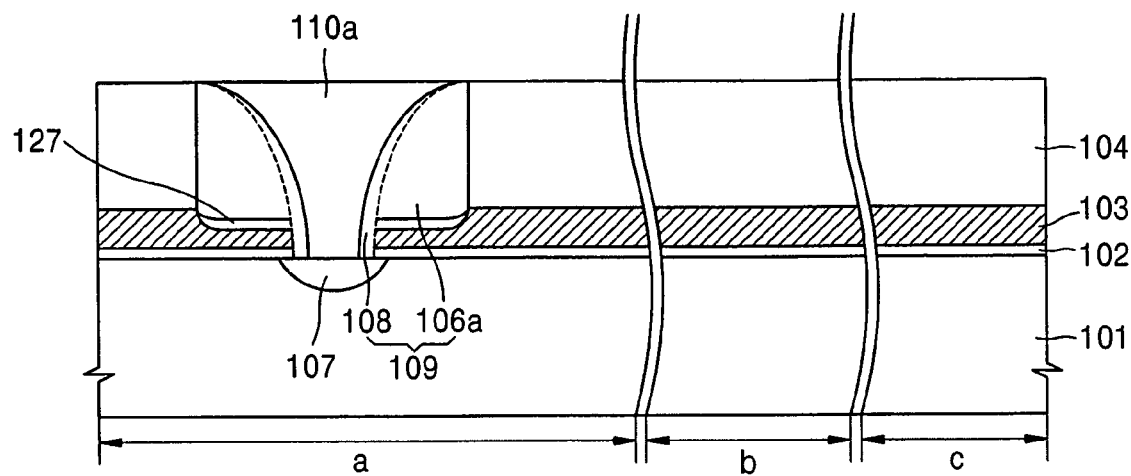

Referring to FIG. 16, after a source conductive film is formed on the entire surface to fill trench 105, CMP is performed on the source conductive film until the mold film 104 is again exposed. Then, a source line 110a is formed in the trench 105.

Figure 17:
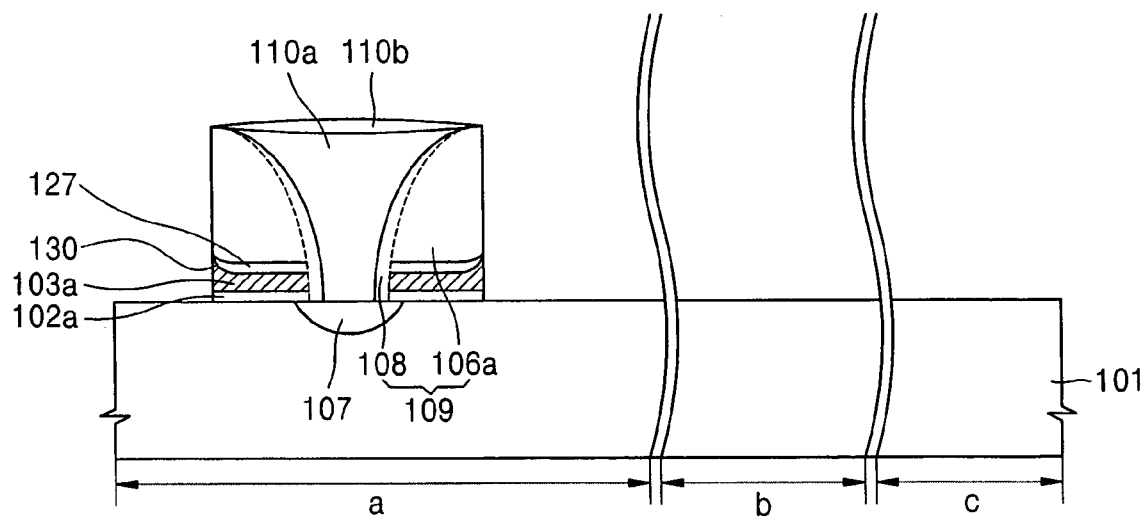

Referring to FIG. 17, an upper portion of source line 110a is thermally oxidized to form a mask film 110b. Exposed mold film 104, floating gate conductive film 103, and coupling insulating film 102 are thereafter sequentially etched to expose the semiconductor substrate 101 as shown. Mask film 110b protects source line 110a from damage during the process where mold film 104 and floating gate conductive film 103 are etched. In this manner, floating gate 103a, which is insulated by the spacer 109 and coupling insulating film 102a, is formed. Further, semiconductor substrate 101 portions corresponding to the peripheral circuit regions "b" and "c" are exposed.

Figure 18:
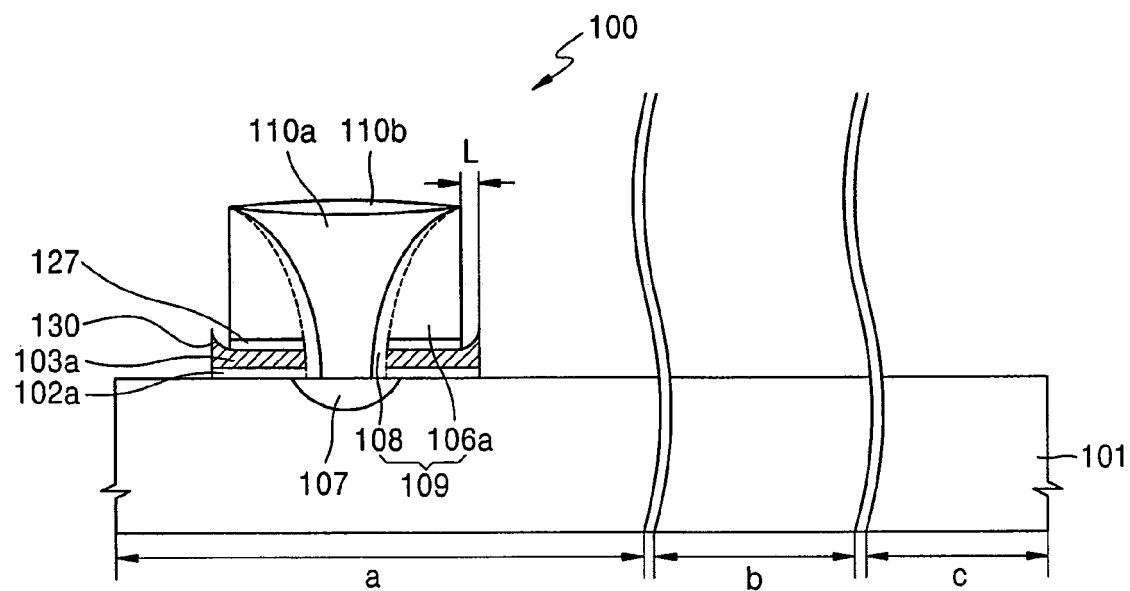

Referring to FIG. 18, a pre-cleaning of the exposed portions of semiconductor substrate 101 is performed in order to subsequently form an insulating film layer and achieve a tip overlap of the floating gate 103a. Floating gate formation has heretofore included forming the coupling insulating film 102a, floating gate 103a, spacers 109, and source line 110a. During pre-cleaning, a cleaning agent is used in such a manner that an outer sidewall (i.e., the side farthest from source line 110a) of spacer 109 erodes by a predetermined distance "L", preferably between 50–300 Å, as measured from the outer edge of the coupling insulating film 102a. The (outer) tip portion of floating gate 103a remains after floating gate conductive film 103 and coupling insulating film 102 are etched.

The cleaning agent preferably contains hydrofluoric acid (HF) and may have a volume ratio of water to the HF of 100:1–200:1. The cleaning agent may further contain SC1. The pre-cleaning forms a step between the outer edge of spacer 109 and an outer edge of the tip portion of floating gate 103a. This step creates an overlap between the tip portion of floating gate 103a and the control gate (later formed). This overlap improves the erasure characteristics of the overall flash memory device.

In related embodiments of the present invention, the coupling insulating film 102 is etched to expose the semiconductor substrate 101. Pre-cleaning is performed to form the tip portion of floating gate 103a. Alternatively, pre-cleaning may be performed to both remove the coupling insulating film 102 and form the tip portion of floating gate 103a. Alternatively, the floating gate 103a may be formed without forming a pronounced tip portion.

Figure 19:
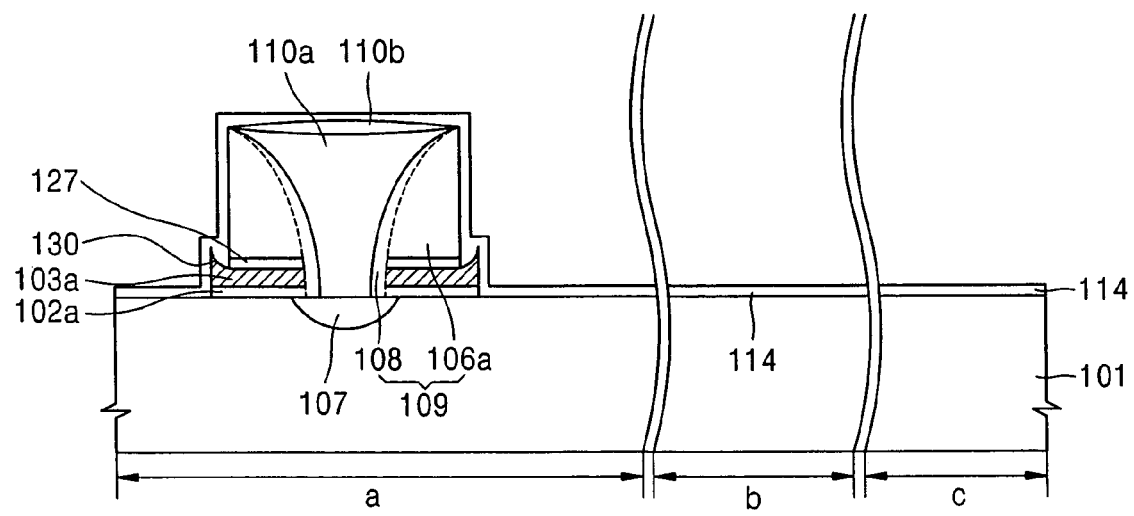

Referring still to FIG. 19, first insulating film 114 preferably formed from an oxide layer is formed on the entire surface of the resultant structure. First insulating film 114 is preferably formed with a thickness that takes into account the effect of the cleaning process, as well as the oxide film formation process to be subsequently performed, such that a high voltage gate insulating film having a desired thickness is ultimately obtained.

Figure 20:
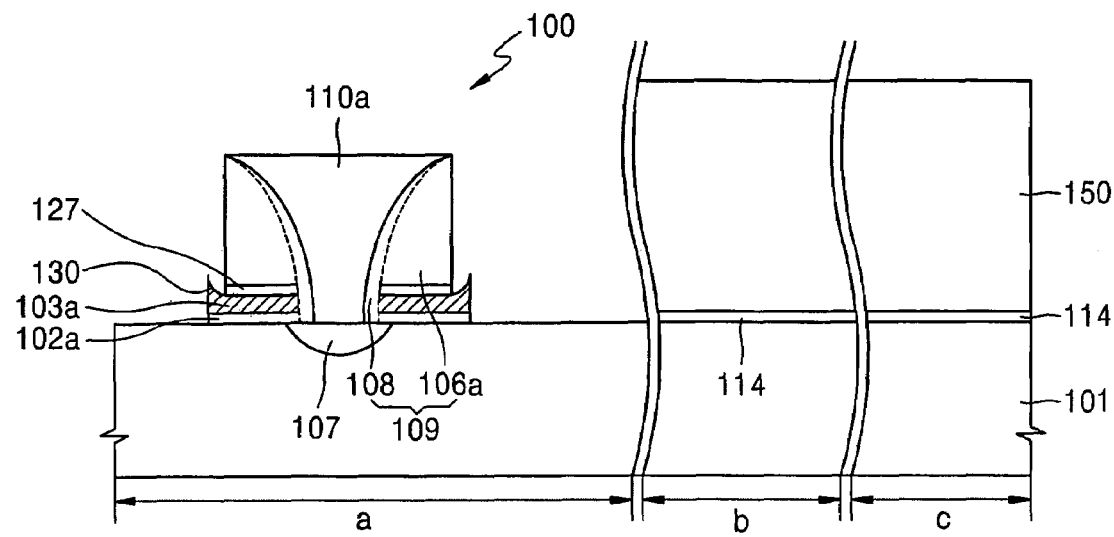

Referring now to FIG. 20, first insulating film 114 is patterned using, for example, a photolithography etching process and a wet etching. In other words, a photoresist film pattern 150 having an opening exposing only the cell region of the semiconductor substrate is used as an etching mask. Wet-etching is performed, such that a first portion of first insulating film 114 formed on the peripheral circuit regions "b" and "c" remain while a second portion of first insulating film 114 formed on the cell region is removed.

Figure 21:
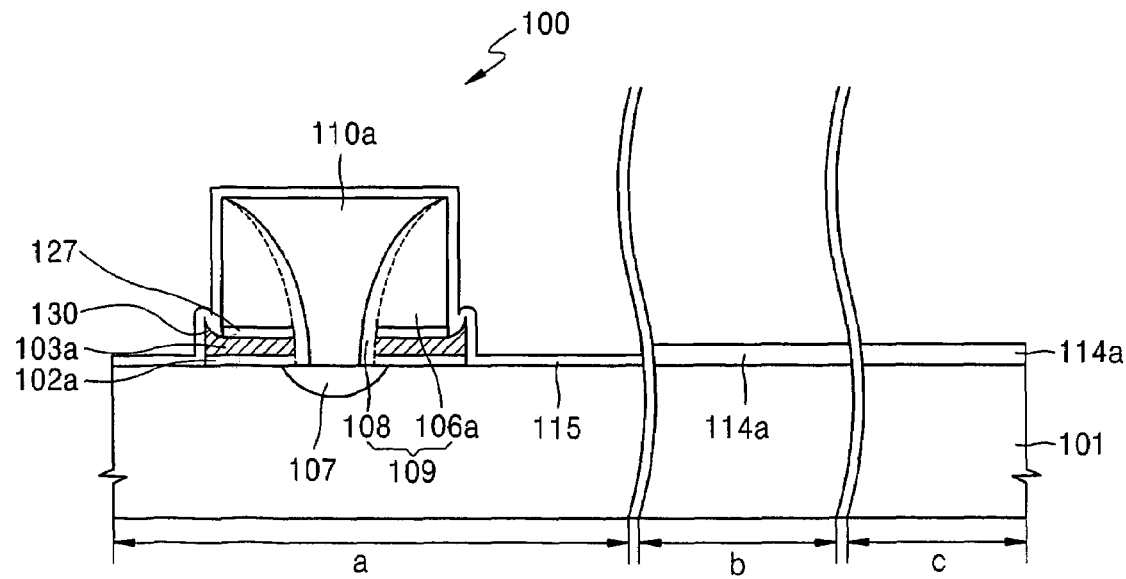

Referring to FIG. 21, after the photoresist film 150 is removed and pre-cleaning is performed, a first (overlaying) oxide film is formed on the entire resulting surface, thereby forming a second insulating film, or control gate insulating film and a tunnelling insulating film, 115. Accordingly, the second insulating film 115 comprises a tunnelling insulating film and the control gate insulating film and is formed on the floating gate and cell region "a" of the semiconductor substrate 101. A further resulting oxide film, or third insulating layer 114a, being thicker than second insulating film 115, is formed on the peripheral circuit regions "b" and "c" of semiconductor substrate 101.

After pre-cleaning but before formation of second insulating film 115, an oxide film on the high voltage region "b" of semiconductor substrate 101 remains. The thickness of this remaining oxide layer is equal to the difference between the thickness of third insulating film 114a and the thickness of second insulating film 115. While forming the second insulating film 115, third insulating film 114a having a thickness greater than the thickness of the second insulating film 115, is formed on the high voltage region "b" of semiconductor substrate 101. Either a CVD oxide film or a thermal oxide film is preferably used to form the second insulating film 115. When using the CVD oxide film, the density of the CVD oxide film may be greater.

Figure 22:
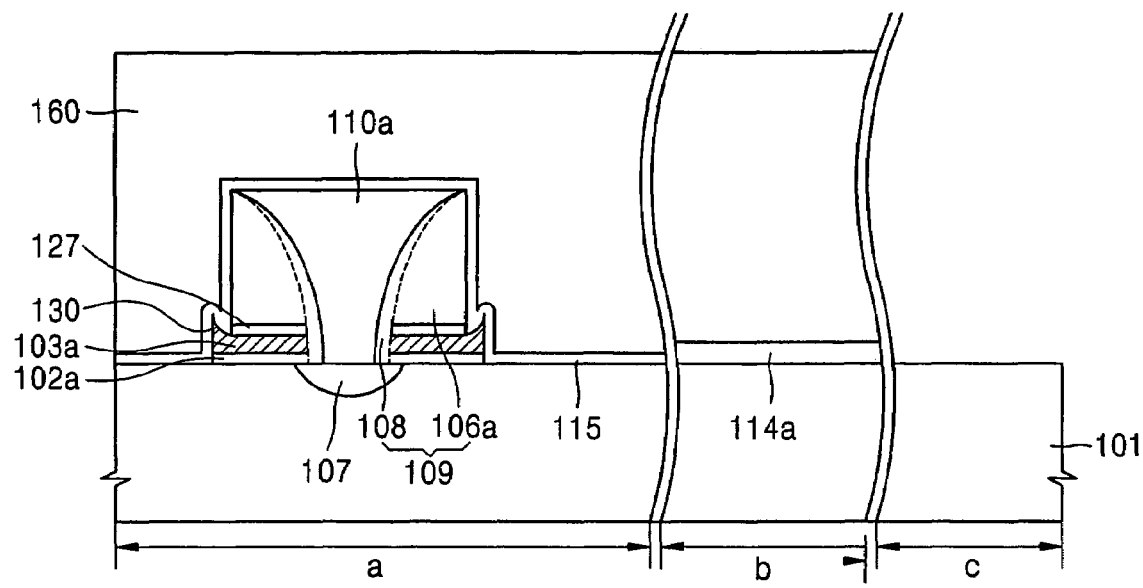

Referring to FIG. 22, a portion of the third insulating film 114a on the low voltage region "c" is removed by wet etching again using a region selective photolithography etching process. That is, a photoresist film pattern 160 having an opening over only the low voltage region "c" is used as an etching mask for a wet-etching process. The second and third insulating films, 115 and 114a, on the cell region "a" and the high voltage region "b", respectively, remain, as only the portion of third insulating film 114a on low voltage region "c" is removed.

Figure 23:
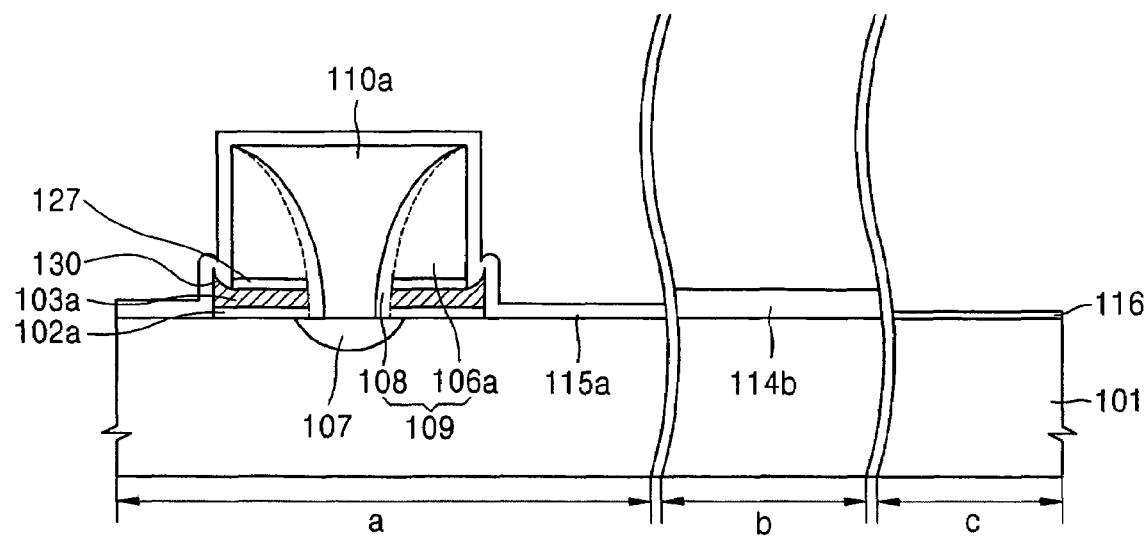

Referring to FIG. 23, photoresist film pattern 160 is removed and then pre-cleaning is performed. An second (overlaying) oxide film resulting in the formation of a fourth insulating film, or low voltage gate insulating film, 116 is formed on the entire surface. Accordingly, fourth insulating film 116 is formed on the low voltage region "c" of semiconductor substrate 101. The fourth insulating film also contributes layer thickness to the second insulating film 115a and the third insulating film 114b formed respectively on high voltage region "b" and cell region "a" of semiconductor substrate 101. First insulating film 115a is preferably thicker than fourth insulating film 116. Consequently, as shown in FIG. 23, second insulating film 115a is thinner than third insulating film 114b.

Figure 24:
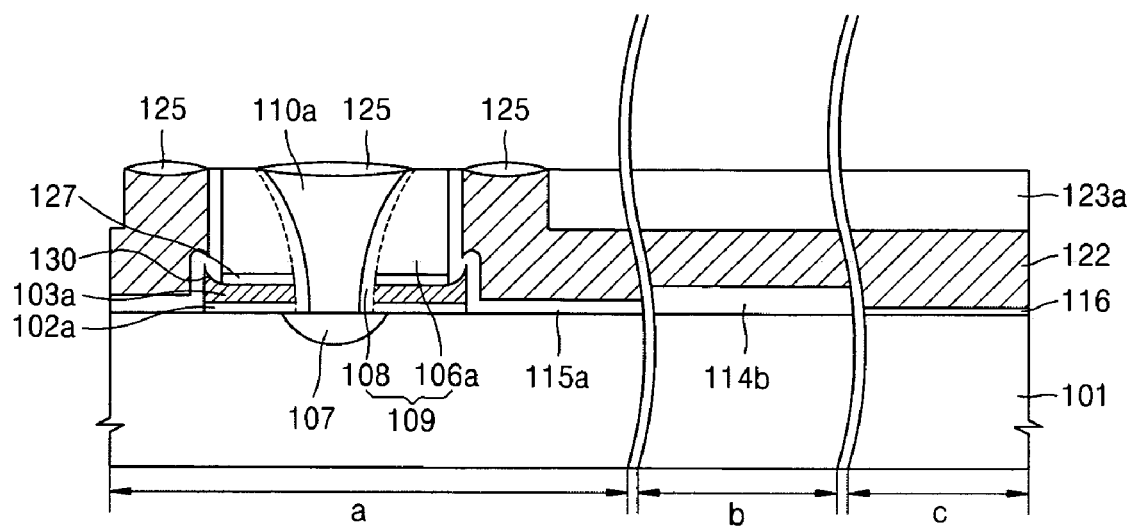

Referring to FIG. 24, a control gate conductive film 122 preferably formed from a conductive polycrystalline silicon film and an oxidation prevention film 123 (not shown) preferably formed from a silicon nitride film are sequentially formed on the entire surface of the resultant structure shown in FIG. 23. A CMP process is applied to oxidation prevention film 123 (not shown) and control gate conductive film 122 until an upper surface of source line 110a is exposed. An oxidation prevention film pattern 123a is formed in both the cell region "a" and the peripheral circuit regions "b" and "c". An upper surface portion of control gate conductive film 122 is exposed between spacer 109 and oxidation prevention film pattern 123a. The exposed upper surface of control gate conductive film 122 and the upper surface of source line 110a are thermally oxidized to form a hard mask film 125.

Figure 25:
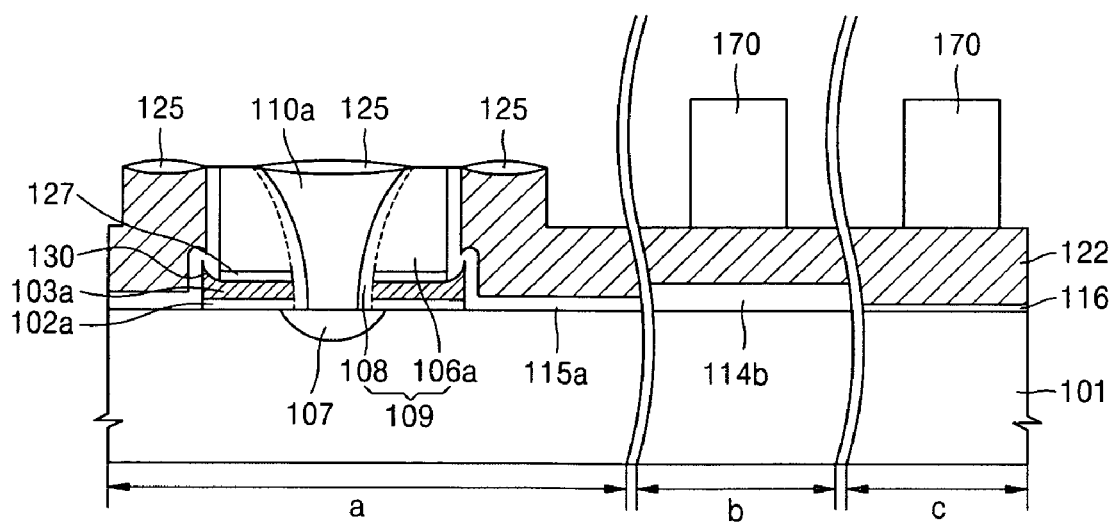

Referring now to FIG. 25, oxidation prevention film pattern 123a is etched using hard mask film 125 as an etching mask to expose a portion of control gate conductive film 122 under the oxidation prevention film pattern 123a. A photoresist film pattern 170 is then formed to define transistor gate regions in both the high voltage region "b" and low voltage region "c".

Figure 26:
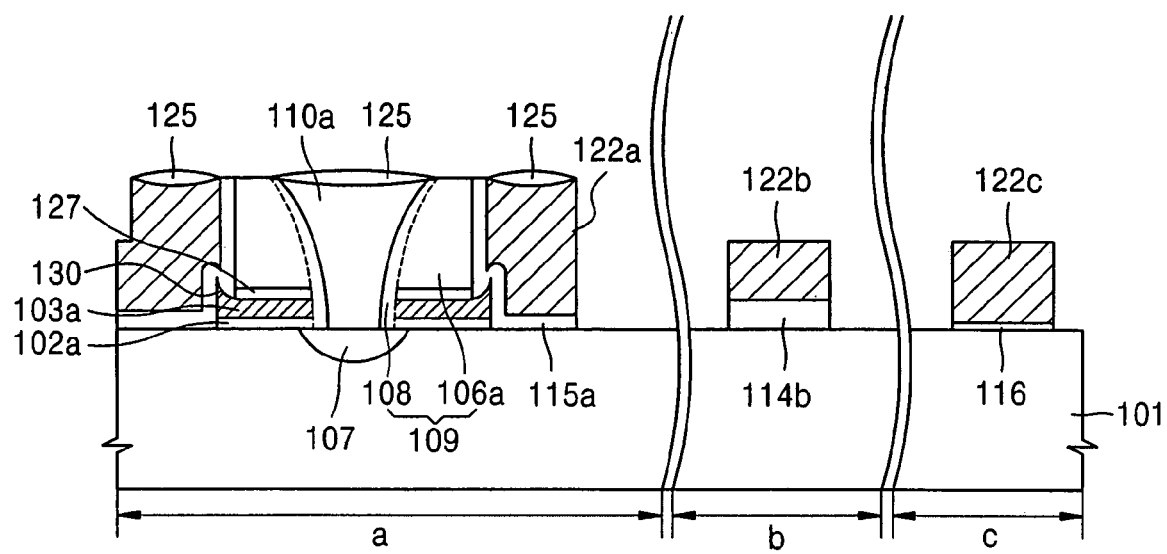

Referring to FIG. 26, anisotropic etching is performed using the hard mask film 125 and the photoresist film pattern 170 as an etching mask to form a control gate line 122a in the cell region "a" and transistor gates 122b and 122c in the peripheral circuit regions "b" and "c". A nitride spacer (not shown) is formed on a sidewall of the control gate line 122a and the section of the semiconductor substrate 101 corresponding to a region where a drain junction region will ultimately be formed is exposed. Ions are preferably implanted into the semiconductor substrate 101 to form the drain junction region (not shown).

A method of manufacturing for a split-gate flash memory device in accordance with embodiments of the present invention has been described with reference to FIGS. 10 through 26. As illustrated by the example shown in FIG. 26, the second insulating film 115a formed in cell region "a" is preferably thinner than the third insulating film 114b formed in high voltage region "b". Fourth insulating film 116 formed in low voltage region "c" is preferably thinner than the second insulating film 115a formed in cell region "a". Accordingly, the high voltage gate insulating film and the tunneling insulating film are optimally formed with different thicknesses, so that the erasure efficiency of the memory cell in the split-gate flash memory device is enhanced. Additionally, the high voltage gate insulating film is formed with a sufficient thickness, such that a related high voltage transistor enjoys stable operation.

According to the foregoing embodiments, insulating films 115a, 114b, and 116, which preferably have different thicknesses according to the regions in which they are formed, may optionally be formed separately or at the same time. As a result, the number of associated photolithography etching steps can be reduced.

In the foregoing embodiments, the formation of a trench (e.g., denoted by a reference numeral 105 in FIG. 11), preferably provides that both bottom corners of the trench be etched or further etched to become rounded. In this manner, tip 130 of the floating gate 103a may be made acute. As shown in FIG. 18, the outer sidewall of spacer 109 is eroded by a predetermined distance "L" to form a step at a tip portion of floating gate 103a, such that tip 130 overlaps control gate 122a, as shown in FIG. 26. This resulting configuration enhances erasure efficiency of the constituent memory cell.

FIGS. 27 through 31 are cross-sectional views illustrating a method of manufacturing a split-gate flash memory, according to additional embodiments of the present invention.

Figure 27:
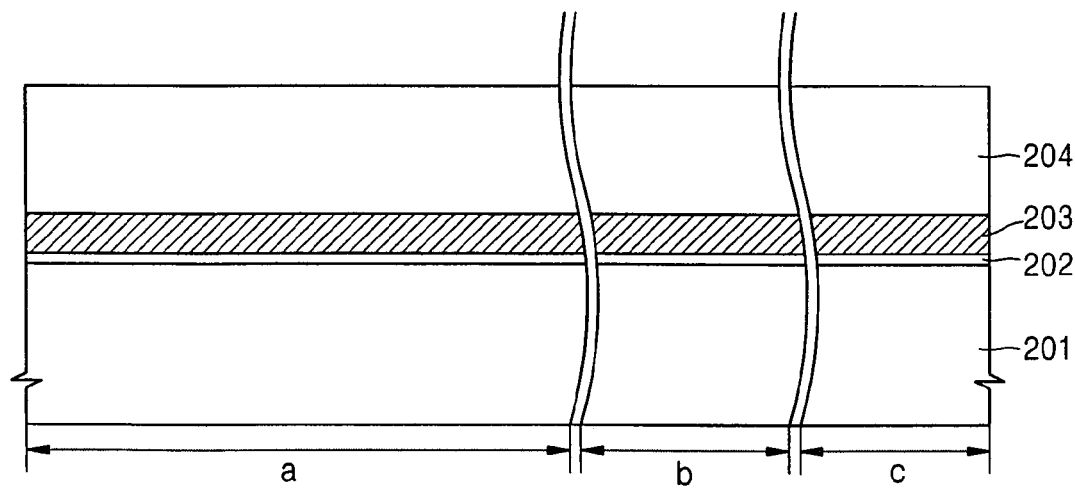
FIGS. 27 through 31 are cross-sectional views illustrating a method of manufacturing a split-gate flash memory according to another embodiment of the present invention.

Referring to FIG. 27, a coupling insulating film 202, a floating gate conductive film 203, and a mold film 204 are sequentially formed on a semiconductor substrate 201.

Figure 28:
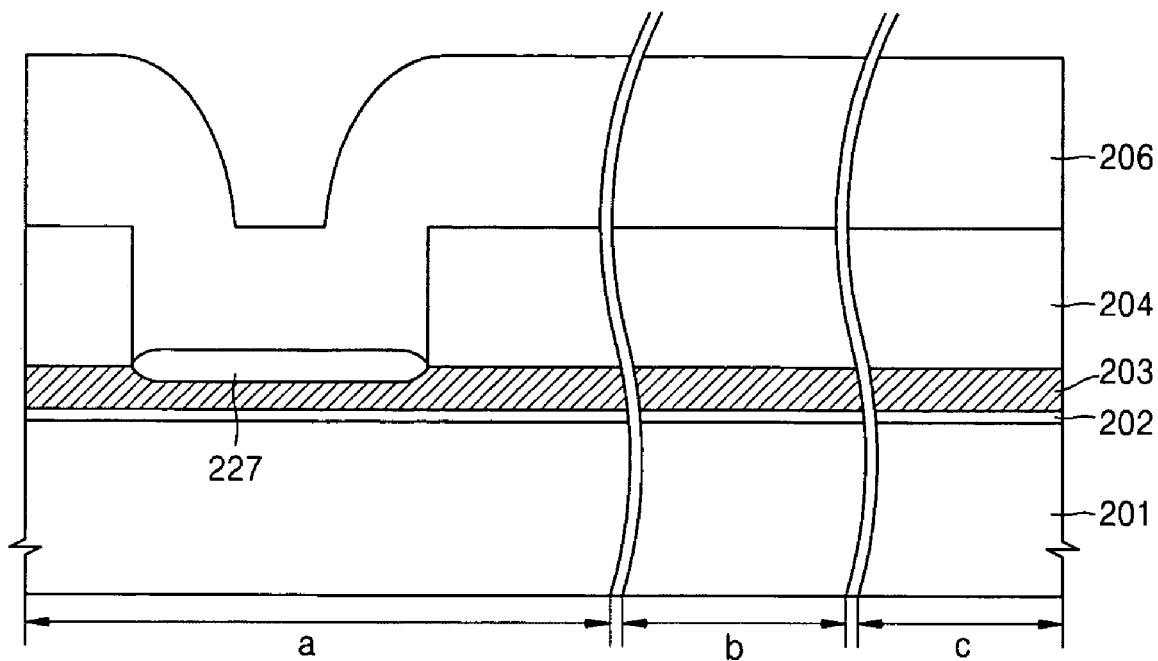

Referring to FIG. 28, mold film 204 is selectively etched until a predetermined portion of floating gate conductive film 203 is exposed. Then, a trench is formed. The exposed floating gate conductive film 203 is not etched. After the trench is formed, the exposed portion of the floating gate conductive film 203 is thermally oxidized to a relatively great thickness in order to form a thermal oxide film 227 that is similar to a Local Oxidation of Silicon (LOCOS) element. A tip portion of the floating gate (to be formed subsequently) can be made sharper (more acute) by means of thermal oxide film 227. A silicon oxide film 206 is formed to fill the trench.

Figure 29:
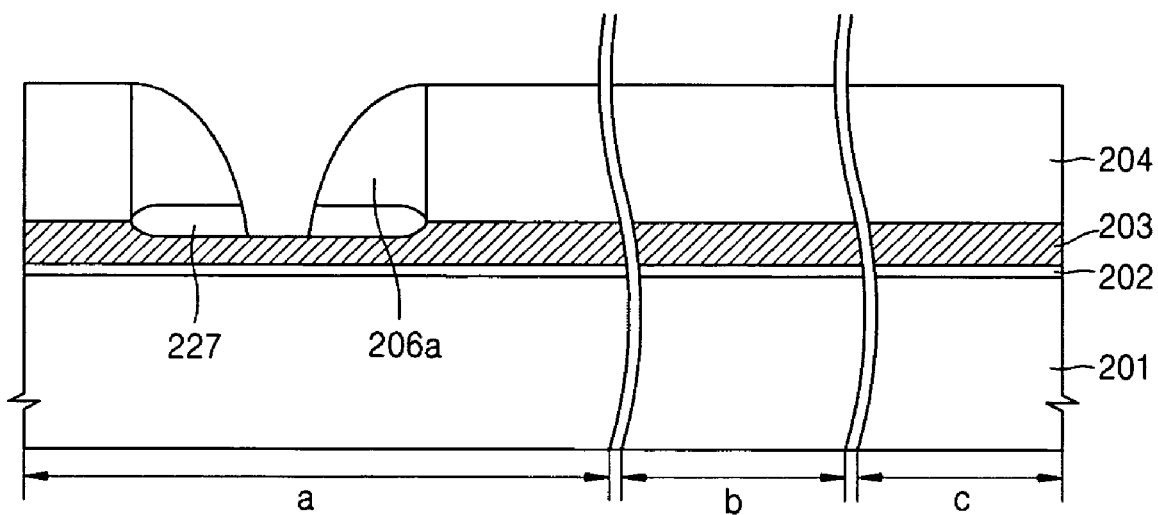

Referring to FIG. 29, silicon oxide film 206 is etched back to form preliminary spacers 206a on both sidewalls of the trench.

Figure 30:
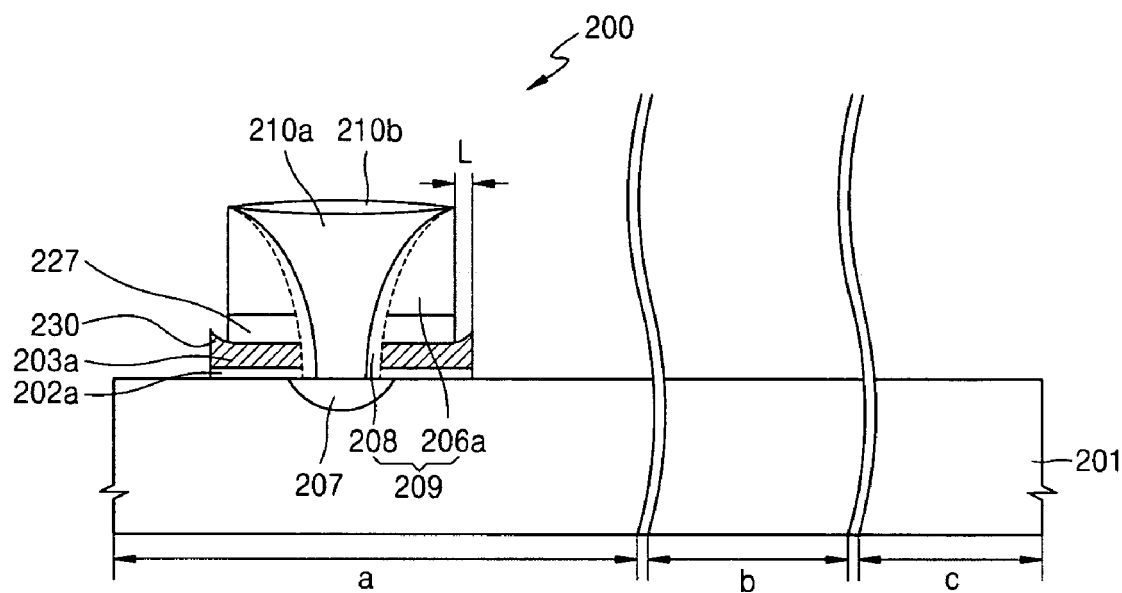

Referring to FIG. 30, the floating gate construction 200 has a coupling insulating film 202a, a floating gate 203a, a spacer 209, and a source line 210a over the semiconductor substrate 201. Spacer 209 is eroded by a predetermined distance "L" from a tip 230 of floating gate 203a. Since the upper surface of the floating gate conductive film exposed by the trench is not etched to become rounded, but is thermally oxidized to become similar in form to the LOCOS element shown in FIG. 28, thermal oxide film 227 with a relatively large thickness is formed on the upper surface of floating gate 203a.

Figure 31:
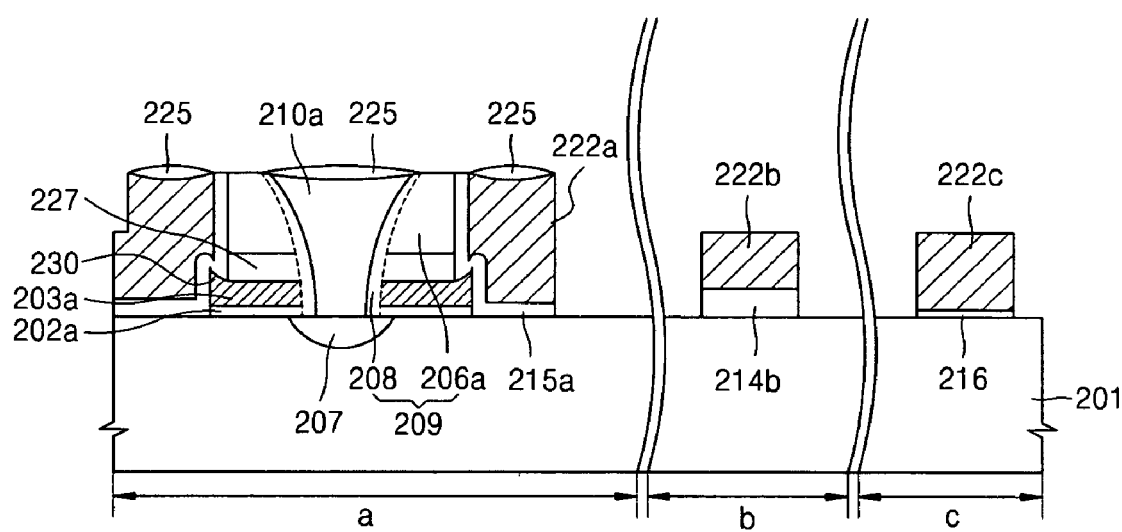

Similar processes to those described above are performed to obtain a structure having insulating films 215a, 214b, and 216 which have different thicknesses according to the different regions "a", "b" and "c", as shown in FIG. 31. An oxide film is formed on the entire surface of substrate 201 to form a high voltage gate insulating film. The oxide film on the cell region "a" is etched. Pre-cleaning is performed and an oxide film is formed on the entire surface of semiconductor substrate 201 to form a control gate insulating film and a tunneling insulating film. The oxide film on the low voltage region "c" is etched. Pre-cleaning is performed and an oxide film is formed on the entire surface of semiconductor substrate 201 to form a low voltage insulating film. A control gate line 222a, a high voltage transistor gate 222b, and a low voltage transistor 222c are then formed. Accordingly, the gate insulating film or the tunneling insulating film can be formed with thicknesses suitable for the respective voltage conditions of the regions "a", "b" and "c". Once a nitride film spacer is formed on a sidewall of control gate line 222a, a drain junction region (not shown) for the associated memory transistor can be formed.

As has been described, in one aspect of the present invention a method of manufacturing a split-gate flash memory provides a tunneling gate insulating film/control gate insulating film on a corresponding cell region, a low voltage gate insulating film on a corresponding low voltage region, and a high voltage gate insulating film on a corresponding high voltage region. These tree region specific insulating films are preferably formed with different thicknesses. This aspect of the present invention enhances the erasure efficiency of a flash memory cell. Additionally, the high voltage gate insulating film is formed to be sufficiently thick, such that a related high voltage gate transistor enjoys stable operation.

According to a related aspect of the present invention, the gate insulating film, or the tunneling insulating film have different thicknesses in accordance with their respective region of formation, and may further be formed separately or at the same time. Accordingly, the formation of these various insulating films with different thicknesses may be accomplished with a reduced number of photolithography steps. This reduction in constituent steps reduces overall production costs.

In yet another aspect of the present invention, the floating gate conductive film is etched to be rounded, and pre-cleaning process is performed such that the outer sidewall of a related spacer is eroded. Thereby, the tip of the floating gate can be formed acutely and with an overlap between the tip and the control gate. Accordingly, erasure efficiency for the memory cell is further enhanced.

The foregoing detailed description on the present invention references several embodiments. However, the present invention is not limited to only the exemplary embodiments, but is defined by the attached claims.

What is claimed is:

1. A method of manufacturing split gate flash memory on a substrate having a surface divided into a cell region and peripheral regions, the peripheral regions comprising a high voltage region and a low voltage region, the method comprising:

forming a floating gate on the cell region;

forming a first insulating film on the surface of the semiconductor substrate;

selectively etching the first insulating film to remove the first insulating film from the cell region;

forming a first oxide film on the surface of the semiconductor substrate to form a second insulating film on the cell region and a third insulating film on the peripheral circuit regions;

selectively etching the third insulating film to remove the third insulating film formed on the low voltage region; and, forming a second oxide film on the surface of the semiconductor substrate to form a fourth insulating film on the low voltage region;

wherein the second insulating film forms a control gate insulating film and a tunneling insulating film in the cell region, the third insulating film forms a high voltage gate insulating film in the high voltage region, and the fourth insulating film forms a low voltage gate insulating film in the low voltage region.

2. The method of claim 1, wherein the control gate insulating film and the tunneling insulating film are thicker than the low voltage gate insulating film, and the high voltage gate insulating film is thicker than the control gate insulating film and the tunneling insulating film.

3. The method of claim 1, wherein the floating gate comprises:

a coupling insulating film formed on the semiconductor substrate;

a floating gate formed on the coupling insulating film;

a thermal oxide film formed on the floating gate;

a spacer formed to surround the floating gate, the thermal oxide and the coupling insulating film; and a source line contacting the spacer.

4. The method of claim 3, wherein the floating gate further comprises a step between a tip portion of the floating gate and the first spacer.

5. The method of claim 1, wherein forming the floating gate on the cell region comprises:

sequentially forming a coupling insulating film, a floating gate conductive film and a mold film on the surface of the semiconductor substrate;

selectively etching the mold film in the cell region to form a trench exposing a portion of the floating gate conductive film;

forming a thermal oxide film on the exposed portion of the floating gate conductive film;

forming preliminary spacers on sidewalls of the trench;

sequentially etching a region of the exposed floating gate conductive film between the preliminary spacers and an underlying portion of the coupling insulating film using the mold film and the preliminary spacers as an etching mask to expose a portion of the semiconductor substrate;

forming liner spacers on exposed surfaces of the preliminary spacers and exposed sidewalls of the floating gate conductive film;

implanting ions into the exposed portion of the semiconductor substrate to form a source junction region;

forming a source line between the liner spacers; and sequentially removing portions of the mold film, the floating gate conductive film, and the coupling insulating film to expose at least portions of the semiconductor substrate corresponding to peripheral regions.

6. The method of claim 5, wherein forming the floating gate on the cell region further comprises:

selectively etching the mold film to form a trench exposing a portion of the floating gate conductive film, and thereafter forming the thermal oxide film on the exposed portion of the floating gate conductive film; and, further etching an upper surface of the floating gate conductive film exposed by the trench to round etch bottom corners of the trench.

7. The method of claim 5, wherein forming the floating gate on the cell region further comprises:

after forming the source line, thermally oxidizing an upper surface of the source line to form a mask film.

8. The method of claim 5, wherein forming the floating gate on the cell region further comprises:

after sequentially removing the mold film, the floating gate conductive film, and the coupling insulating film, performing a pre-cleaning before formation of the first insulating film.

9. The method of claim 8, wherein the pre-cleaning removes an outer sidewall portion of the preliminary spacer to form a tip portion of the floating gate overlapping a control gate line formed proximate the floating gate.

10. The method of claim 9, wherein the removed outer sidewall portion of the preliminary spacer ranges in size from 50 to 300 Å.

11. The method of claim 8, wherein the pre-cleaning comprises applying a cleaning agent containing hydrofluoric acid.

12. The method of claim 11, wherein the cleaning agent comprises a volume ratio of water to hydrofluoric acid in the range of from 100:1 to 200:1.

13. The method of claim 1, wherein forming the first oxide film on the surface of the semiconductor substrate adds thickness to the first insulating film in the peripheral regions; and, wherein forming the second oxide film on the surface of the semiconductor substrate adds thickness to the first insulating film in the high voltage region and the second insulating film in the cell region.

14. The method of claim 1, wherein wherein the second insulating film forming the a control gate insulating film and the tunneling insulating film in the cell region, the third insulating film forming the high voltage gate insulating film in the high voltage region, and the fourth insulating film forming the low voltage gate insulating film in the low voltage region have different thickness.

15. The method of claim 14, where the second insulating film is thicker than the fourth insulating film, but less thick than the third insulating film.

16. The method of claim 1, wherein at least one of the first and second oxide films is formed using a CDV process or a thermal oxidation process.

17. The method of claim 16, wherein the at least one first or second oxide films are formed using a CVD process comprising:

forming a CVD oxide film; and performing a rapid thermal annealing on the CVD oxide film.

18. The method of claim 1, further comprising:

before forming the first oxide film on the surface of the semiconductor substrate, performing a pre-cleaning to form the low voltage gate insulating film.

19. The method of claim 1, further comprises:
forming a control gate line proximate the floating gate in the cell region;
and wherein forming the control gate line proximate the floating gate in the cell region, further comprises:
sequentially forming a control gate conductive film, an oxidation prevention film insulating film, and a the low voltage gate insulating film;
planarizing the oxidation prevention film and the control gate conductive film to expose an upper surface of the source line and a portion of the control gate conductive film in the cell region, and thereafter patterning the oxidation prevention film in the cell region and the peripheral circuit regions;
forming a hard mask film on the exposed upper surface of the source line and the exposed upper surface of the control gate conductive film;
etching the oxidation prevention film pattern using the hard mask film as an etching mask to expose the control gate conductive film under the oxidation prevention film pattern; and
anisotropically etching the control gate conductive film using the hard mask film as an etching mask.

20. The method of claim 19, wherein forming a control gate line in the cell region further comprises:
after etching the oxidation prevention film pattern, forming a photoresist film pattern to define at least one transistor gate region in the peripheral circuit regions;
wherein when the gate conductive film is anisotropically etched to form the control gate line in the cell region and at least one transistor gate in the peripheral circuit regions.

* * * * *